United States Patent
Shi (10) Patent No.: US 10,833,292 B2
(45) Date of Patent: Nov. 10, 2020

(54) ORGANIC LIGHT-EMITTING DIODE DISPLAY PANEL

(71) Applicant: WUHAN CHINA STAR OPTOELECTRONICS TECHNOLOGY CO., LTD., Hubei (CN)

(72) Inventor: Jie Shi, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/329,246

(22) PCT Filed: Feb. 21, 2019

(86) PCT No.: PCT/CN2019/075684
§ 371 (c)(1),
(2) Date: Feb. 28, 2019

(87) PCT Pub. No.: WO2020/124781
PCT Pub. Date: Jun. 25, 2020

(65) Prior Publication Data
US 2020/0203660 A1    Jun. 25, 2020

(30) Foreign Application Priority Data
Dec. 20, 2018  (CN) .......................... 2018 1 1560802

(51) Int. Cl.
*H01L 51/52*    (2006.01)
*H01L 51/00*    (2006.01)
*H01L 27/32*    (2006.01)

(52) U.S. Cl.
CPC .......... *H01L 51/5256* (2013.01); *H01L 27/32* (2013.01); *H01L 51/0096* (2013.01); *H01L 2251/53* (2013.01)

(58) Field of Classification Search
CPC ....... H01L 51/00; H01L 51/50; H01L 51/428; H01L 51/448; H01L 51/525; H01L 51/0096; H01L 51/5287; H01L 51/5032; H01L 51/5296; H01L 51/0508;
(Continued)

(56) References Cited

U.S. PATENT DOCUMENTS

| 2014/0131683 A1 | 5/2014 | Kim et al. |
| 2014/0133282 A1 | 5/2014 | Hamm |
| 2015/0200370 A1 | 7/2015 | Unnikrishnan et al. |

(Continued)

FOREIGN PATENT DOCUMENTS

| CN | 103811530 A | 5/2014 |
| CN | 103811672 A | 5/2014 |

(Continued)

*Primary Examiner* — Chuong A Luu
(74) *Attorney, Agent, or Firm* — Mark M. Friedman (57) ABSTRACT

The present invention provides an organic light-emitting diode (OLED) display panel, wherein a display area of the OLED display panel is formed with a via hole and a water blocking structure for protecting the via hole from water vapor. The water blocking structure includes at least one trench defined in a surface of the substrate, and a baffle wall formed in the trench, and a top of the baffle wall is higher than an OLED emitting layer.

18 Claims, 5 Drawing Sheets

(58) Field of Classification Search
CPC .............. H01L 51/0512; H01L 51/4213; H01L 51/5012; H01L 51/52; H01L 51/5256
USPC ........................................................ 257/40
See application file for complete search history.

(56) References Cited

U.S. PATENT DOCUMENTS

| | | |
|---|---|---|
| 2017/0364726 A1* | 12/2017 | Buchan ................ G06K 9/0002 |
| 2018/0240849 A1 | 8/2018 | Kao et al. |
| 2018/0331320 A1 | 11/2018 | Su et al. |
| 2019/0081117 A1* | 3/2019 | Moon ................ H01L 27/3246 |
| 2019/0123115 A1 | 4/2019 | Sun et al. |
| 2019/0267570 A1 | 8/2019 | Huang et al. |

FOREIGN PATENT DOCUMENTS

| | | | |
|---|---|---|---|
| CN | 106876328 | A | 6/2017 |
| CN | 106876428 | A | 6/2017 |
| CN | 107658332 | A | 2/2018 |
| CN | 108039356 | A | 5/2018 |
| CN | 108417737 | A | 8/2018 |
| CN | 108461655 | A | 8/2018 |
| CN | 107968157 | A | 9/2018 |
| CN | 108520895 | A | 9/2018 |
| CN | 108539037 | A | 9/2018 |
| CN | 108574054 | A | 9/2018 |
| EP | 2685515 | A1 | 1/2014 |

* cited by examiner

ORGANIC LIGHT-EMITTING DIODE DISPLAY PANEL

BACKGROUND OF INVENTION

Field of Invention

The present invention relates to the field of display technologies, and in particular, to an organic light-emitting diode (OLED) display panel.

Description of Prior Art

Flexible organic light-emitting diodes (OLEDs) are deformable and flexible display devices, having advantages of self-illumination, wide viewing angles, high contrast, low power consumption, fast response times, etc, compared with traditional rigid displays. OLED luminescent materials are organic materials extremely sensitive to water and oxygen. Generally, flexible OLEDs adopt thin film encapsulation (TFE) technology and an encapsulation layer is generally a multilayered structure composed of stacked inorganic/organic/inorganic layers, wherein water vapor transmission permeance (WVTR) can be reduced to a level about 10-6 g/m2·day to ensure normal operation of OLED luminescent materials.

In preparation of an in-screen O-cut display screen, it is necessary to open a hole in the screen to place a camera therein. To ensure clarity of the camera, the electroluminescence layer (EL) and the encapsulation layer formed by a TFE process need to be hollowed out in the area where the camera is placed. This process causes side surfaces of the EL and TFE layers to be directly exposed to the atmosphere, and water and oxygen may intrude from the side surfaces of the EL and TFE layers, seriously impacting on the service life of a light-emitting device.

In summary, in existing in-screen profile cutting technology, after an OLED display panel is cut, a cutting position is no longer protected by the encapsulation layer, thereby exposing the light-emitting device, and the water vapor may intrude the OLED panel from the cutting position, causing damage to the light-emitting device, thereby negatively affecting display quality of the entire panel.

SUMMARY OF INVENTION

The invention provides an OLED display panel, which is provided with a water blocking structure at the cutting position, which can perform a water blocking protection on the light-emitting device at the cutting position, thereby preventing the water vapor from penetrating into the OLED panel from the cutting position and causing damage to the light-emitting device, solving the technical problems that negatively affect display quality.

In order to solve the above problems, the technical solution provided by the present invention is as follows:

The present invention provides an OLED display panel including a substrate, an OLED light-emitting layer disposed on a surface of the substrate, and a thin film encapsulation layer disposed on a surface of the OLED light-emitting layer.

A display area of the OLED display panel is formed with a via hole, and a water blocking structure for protecting the via hole from water vapor, wherein the water blocking structure includes:

a trench defined in the surface of the substrate, the trench being disposed around the via hole; and a baffle wall formed in the trench and protruding from the surface of the OLED light-emitting layer, wherein a contour shape of the baffle wall is the same as a contour shape of the via hole, and the via hole is located at a center of the contour of the baffle wall;

wherein the thin film encapsulation layer includes a water blocking layer and a stress buffer layer which are stacked on each other, and an edge of an opening of the water blocking layer is aligned with an edge of the via hole, and the stress buffer layer is formed outside the baffle wall.

According to a preferred embodiment of the invention, an inner wall of the trench is inclined or curved toward a center of the trench.

According to a preferred embodiment of the invention, the water blocking structure includes a first sub-trench and a second sub-trench, the first sub-trench being disposed around the via hole, the second sub-trench being disposed around the first sub-trench; and a first sub-baffle wall is disposed in the first sub-trench, and a second sub-baffle wall is disposed in the second sub-trench.

According to a preferred embodiment of the invention, a height of the first sub-baffle wall is greater than a height of the second sub-baffle wall.

According to a preferred embodiment of the invention, the stress buffer layer is formed outside the second sub-baffle wall.

According to a preferred embodiment of the invention, the stress buffer layer is formed outside the first sub-baffle wall and covers the second sub-baffle wall.

According to a preferred embodiment of the invention, the baffle wall is made of a curable liquid moisture absorbent or an organic material doped with moisture absorbing particles.

According to a preferred embodiment of the invention, the surface of the substrate is further provided with a crack arresting member, and the crack arresting member is disposed around the via hole, and located between the baffle wall and the via hole.

According to a preferred embodiment of the invention, the contour shape of the via hole is a regular planar pattern or an irregular planar pattern.

According to a preferred embodiment of the invention, the via hole is located at a position close to an edge of the OLED panel, or the via hole is integrally defined by the edge of the OLED panel.

The present invention further provides another organic light-emitting diode (OLED) display panel, including: a substrate, an OLED light-emitting layer disposed on a surface of the substrate, and a thin film encapsulation layer disposed on a surface of the OLED light-emitting layer, wherein the display area of the OLED display panel is formed with a via hole and a water blocking structure for preventing the via hole from water vapor, and the water blocking structure includes:

a trench defined in the surface of the substrate, the trench being disposed around the via hole; and a baffle wall formed in the trench and protruding from the surface of the OLED light-emitting layer; wherein the thin film encapsulation layer includes a water blocking layer and a stress buffer layer which are stacked on each other, and an edge of an opening of the water blocking layer is aligned with an edge of the via hole, and the stress buffer layer is formed outside the baffle wall.

According to a preferred embodiment of the invention, an inner wall of the trench is inclined or curved toward a center of the trench.

According to a preferred embodiment of the invention, the water blocking structure includes a first sub-trench and a second sub-trench, the first sub-trench being disposed around the via hole, the second sub-trench being disposed around the first sub-trench; and a first sub-baffle wall is disposed in the first sub-trench, and a second sub-baffle wall is disposed in the second sub-trench.

According to a preferred embodiment of the invention, a height of the first sub-baffle wall is greater than a height of the second sub-baffle wall.

According to a preferred embodiment of the invention, the stress buffer layer is formed outside the second sub-baffle wall.

According to a preferred embodiment of the invention, the stress buffer layer is formed outside the first sub-baffle wall and covers the second sub-baffle wall.

According to a preferred embodiment of the invention, the baffle wall is made of a curable liquid moisture absorbent or an organic material doped with moisture absorbing particles.

According to a preferred embodiment of the invention, the surface of the substrate is further provided with a crack arresting member, the crack arresting member is disposed around the via hole, and located between the baffle wall and the via hole.

According to a preferred embodiment of the invention, the contour shape of the via hole is a regular planar pattern or an irregular planar pattern.

According to a preferred embodiment of the invention, the via hole is located at a position close to an edge of the OLED panel, or the via hole is integrally defined by the edge of the OLED panel.

Compared with the existing organic light-emitting diode (OLED) display panel, the OLED display panel of the present invention is provided with a water blocking wall at the cutting position, which isolates the light-emitting device at the cutting position and the light-emitting device in the display area from the water vapor, thereby protecting the light-emitting device in the panel from water vapor intrusion, thus prolonging the display life of the OLED display panel. Therefore, the problems of the existing in-screen profile cutting technology can be solved, such as that the cut position is not protected by the encapsulation layer after the OLED display panel is cut, thereby exposing the light-emitting device, and the water vapor intrudes the OLED display panel from the cut position, causing damage to the light-emitting device, which in turn negatively affects the display quality of the entire panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The invention is directed to solve the problems of the existing in-screen profile cutting technology, wherein after an organic light-emitting diode (OLED) display panel is cut, a cutting position is not protected by an encapsulation layer, thereby exposing a light-emitting device, and water vapor intrudes the OLED display panel from a cutting portion, causing damage to the light-emitting device, thereby negatively affecting the entire panel.

Figure 1A:
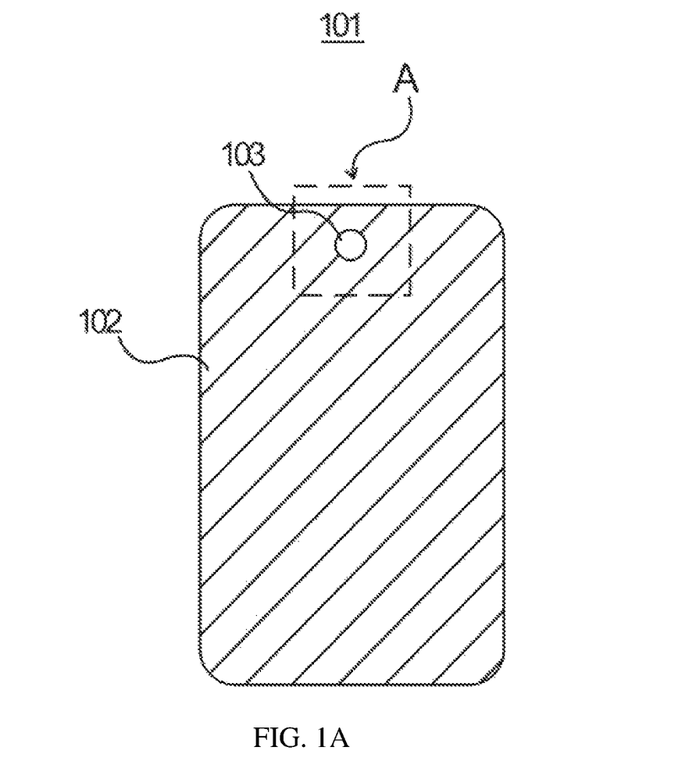
FIG. 1A is a schematic front view showing a structure of an organic light-emitting diode (OLED) display panel according to the present invention.
Figure 1B:
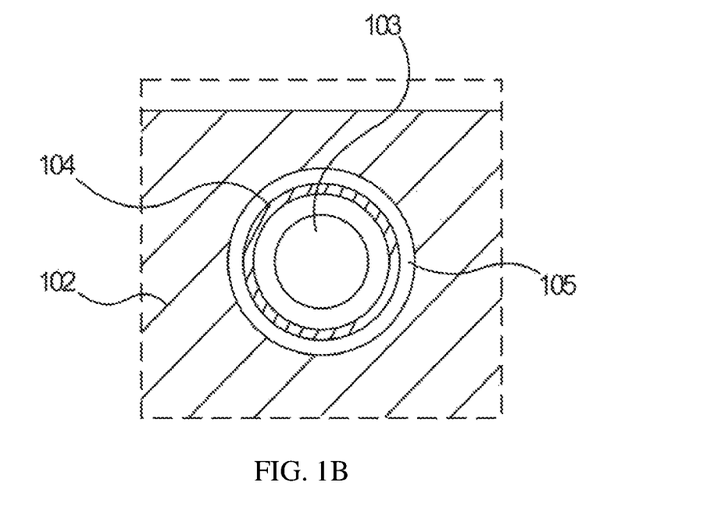
FIG. 1B is an enlarged view of A in FIG. 1A.
Figure 2A:
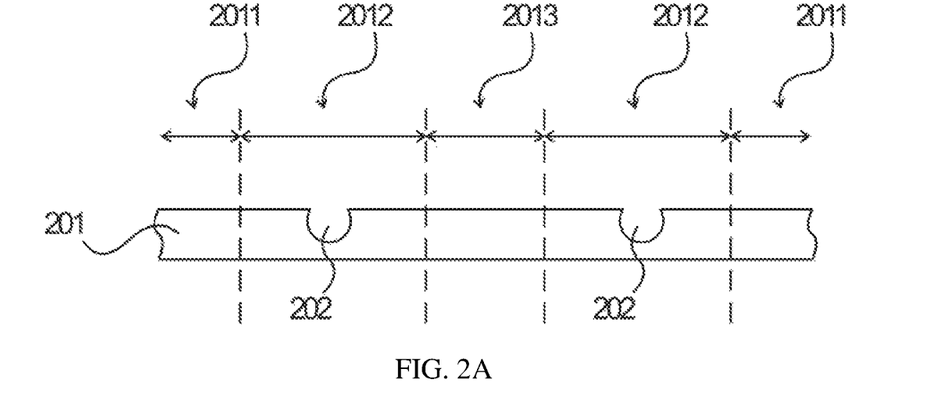
FIGS. 2A to 2F are flow charts for preparing an OLED display panel according to the present invention.
Figure 2B:
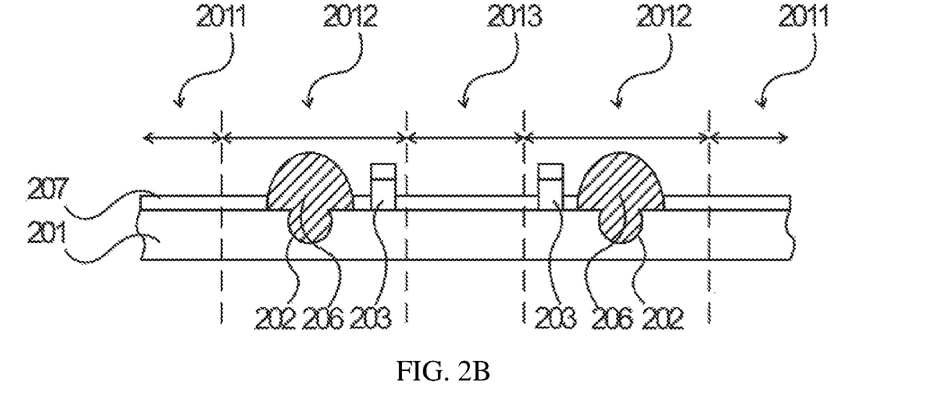

As shown in FIG. 1A and FIG. 2B, in the OLED display panel 101, a display area 102 of the OLED display panel 101 is provided with a via hole 103 for arranging a front camera of a mobile phone, and a contour shape of the via hole 103 may be circle. The via hole 103 may be located at a position close to an edge of the OLED panel. At least one trench (not shown) is provided in films of the OLED display panel 101r, and a baffle wall 104 is formed in the trench for preventing water vapor from entering the OLED display panel 101 through an edge of the via hole 103.

The baffle wall 104 is disposed around the via hole 103, and a vertical spacing between any position of the baffle wall 104 and the edge of the via hole 103 is equal, that is, a contour shape of the baffle wall 104 and a contour shape of the via hole 103 is the same, and the via hole 103 is located at the center of the contour of the baffle wall 104.

The OLED display panel 101 includes a substrate 105, an OLED light-emitting layer disposed on a surface of the substrate 105, and a thin film encapsulation layer disposed on a surface of the OLED light-emitting layer. The via hole 103 penetrates the substrate 105, the OLED light-emitting layer, and the thin film encapsulation layer, wherein the thin film encapsulation layer includes at least a first water blocking layer, a stress buffer layer, and a second water blocking layer which are stacked on each other.

The OLED display panel 101 further includes a water blocking structure, wherein the water blocking structure includes a trench and a baffle wall 104. The trench is defined in a surface of the substrate 105, and the baffle wall 104 is formed in the trench, and higher than the OLED light-emitting layer located on the surface of the substrate 105.

Figure 1C:
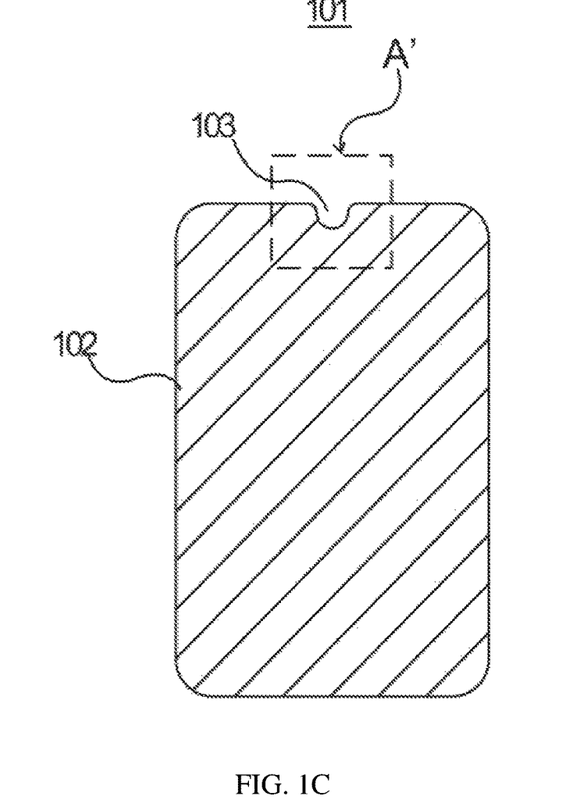
FIG. 1C is a schematic front view showing a structure of another OLED display panel according to the present invention.
Figure 1D:
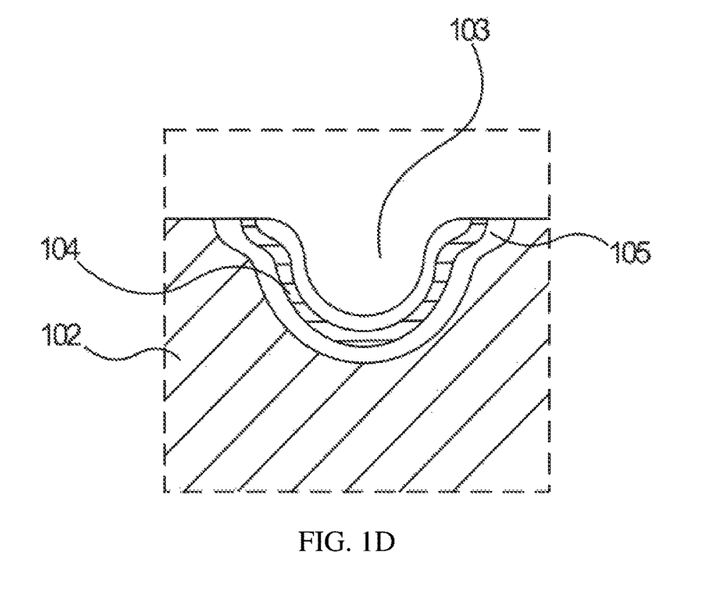
FIG. 1D is an enlarged view of A' in FIG. 1C.

As shown in FIGS. 1C and 1D, in the OLED display panel 101 provided by the present invention, the via hole 103 of the OLED display panel 101 may have a contour shape of a water-drop shape.

Further, the via hole 103 is integrally defined by the edge of the OLED panel.

When the via hole 103 has the contour shape of a water drop, and the via hole 103 is integrally defined by the edge of the OLED panel, the contour shape of the trench is non-enclosed, and the trench is defined along the edge of the via hole 103, an end of the trench extends to an edge of the display panel, and the baffle wall 104 is formed in the trench.

As shown in FIG. 2A, the OLED display panel includes a substrate 201 having a surface defined with a display area 2011, a water blocking area 2012 located in the display area 2011, and a pre-cut area 2013 located in the water blocking area 2012, wherein a trench 202 is formed in the water blocking area 2012.

An inner wall of the trench 202 is inclined or curved toward a center of the trench 202, such that a width of an opening of the trench 202 is smaller than an inner width of the trench 202 to tighten a water blocking material inside the trench 202 to avoid falling off.

For example, in a longitudinal section of the substrate 201, a cross-sectional shape of the trench 202 is a notched circle, and the notched circle is a non-enclosed arc, and any end point of the notched circle is an intersection of the surface of the substrate 201 and a tangent of the notched circle, wherein an angle formed between the surface of the substrate 201 and a tangent of the notched circle is less than 90 degrees.

For another example, in the longitudinal section of the substrate 201, a cross-sectional shape of the trench 202 is a "top-less" trapezoid, and an angle formed between a waist of the trapezoid and the surface of the substrate 201 to which it connects is less than 90 degrees.

The water blocking region 2012 on the surface of the substrate 201 is further provided with a crack arresting member 203, which is disposed around a pre-cutting region 2013, and the crack arresting member 203 is located between the trench 202 and the pre-cutting region 2013. The crack arresting member 203 is used to limit the crack generated by opening a via hole 204 to the circumference of the crack arresting member.

As shown in FIG. 2B, the OLED display panel includes the substrate 201 having the surface defined with the display area 2011, the water blocking area 2012 located in the display area 2011, and the pre-cut area 2013 located in the water blocking area 2012; wherein the trench 202 is formed in the water blocking area 2012.

An OLED light-emitting layer 205 is formed on the surface of the substrate 201. An OLED luminescent material at the trench 202 may be broken and then deposited on a bottom of the trench 202, such that the OLED luminescent material at the edge of the pre-cut region 2013 is blocked from the OLED luminescent material of the display area 2011, thus preventing water vapor from propagating into the display area 2011 from the edge of the via hole 204. Meanwhile, the OLED luminescent material located at the crack arresting member 203 may be deposited on the surface of the crack arresting member 203, and broken from the OLED luminescent material in the display region 2011 such that the OLED luminescent material at the edge of the pre-cut region 2013 is blocked from the OLED luminescent material in the display area 2011, and the crack generated by opening the via hole 204 is prevented from extending into the display area 2011, which may cause damage to the light emitting device in the display area 2011.

After the OLED light-emitting layer 205 is formed, the trench 202 is filled with the water blocking material by an inkjet printing technique or an electrohydrodynamic printing technique, and the water blocking material may be a curable liquid moisture absorbent or an organic material doped with moisture absorbing particles (e.g., CaO nanoparticles), wherein the water blocking material fills the trenches 202 and is higher than the surface of the OLED light-emitting layer 205, and forms a barrier wall 206 after curing.

Figure 2C:
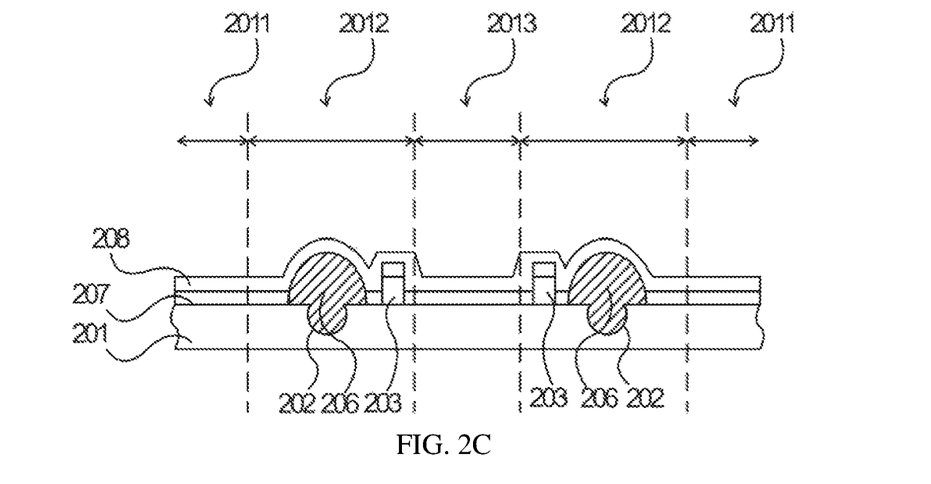

As shown in FIG. 2C, the OLED display panel includes the substrate 201 having the surface defined with a display area 2011, the water blocking area 2012 located in the display area 2011, and the pre-cut area 2013 located in the water blocking area 2012. The trench 202 and the crack arresting member 203 are formed in the surface of the substrate 201, and the surface of the substrate 201 is formed with the OLED light-emitting layer 205, and the baffle wall 206 is formed in the trench 202.

The surface of the substrate 201 is provided with a first water blocking layer 207 covering the display area 2011, the water blocking area 2012, and the pre-cutting area 2013.

The first water blocking layer 207 is a film of an inorganic material, and the material of the first water blocking layer 207 is at least one of Al2O3, TiO2, SiNx, SiCNx, SiOx, and combinations thereof.

Figure 2D:
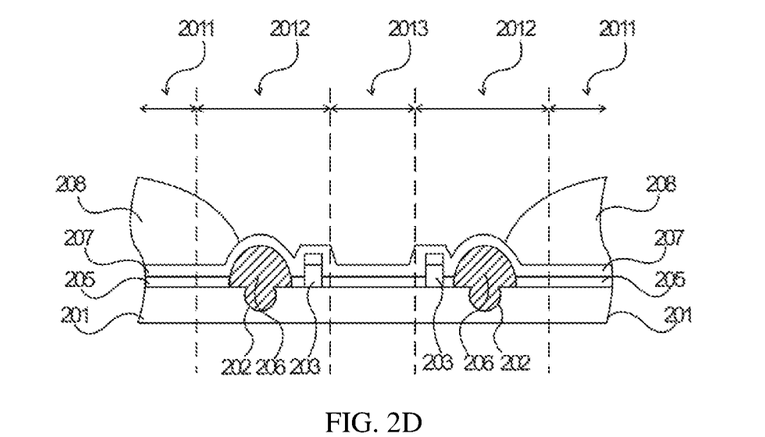

As shown in FIG. 2D, the OLED display panel includes the substrate 201 having the surface defined with a display area 2011, the water blocking area 2012 located in the display area 2011, and the pre-cut area 2013 located in the water blocking area 2012. The trench 202 and the crack arresting member 203 are formed in the surface of the substrate 201, and the surface of the substrate 201 is formed with the OLED light-emitting layer 205, and the baffle wall 206 is formed in the trench 202. The surface of the substrate 201 is provided with the first water blocking layer 207 covering the display area 2011, the water blocking area 2012, and the pre-cutting area 2013.

A surface of the first water blocking layer 207 is provided with a stress buffer layer 208 formed outside the baffle wall 206. The stress buffer layer 208 is an organic material layer for buffering the stress of the OLED panel when the OLED panel is bent or folded to reduce the damage caused by the excessive stress on the OLED light-emitting layer 205. A material of the stress buffer layer 208 is at least one of acrylic, hexamethyl dimethicone, polyacrylate, polycarbonate, polystyrene, and combinations thereof.

Figure 2E:
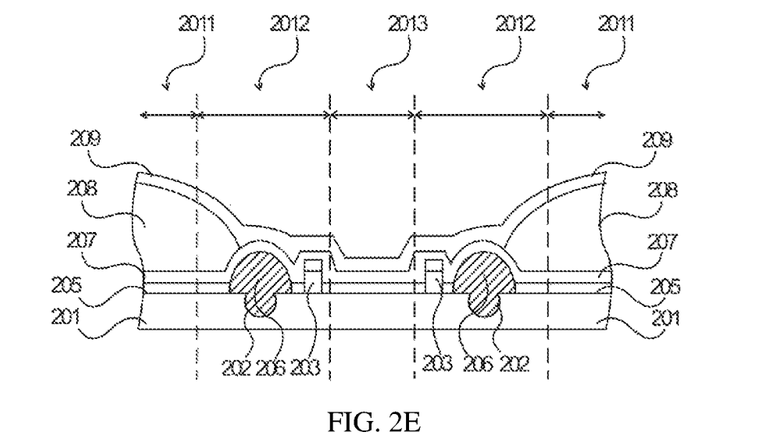

As shown in FIG. 2e, the OLED display panel includes the substrate 201 having the surface defined with a display area 2011, the water blocking area 2012 located in the display area 2011, and the pre-cut area 2013 located in the water blocking area 2012. The trench 202 and the crack arresting member 203 are formed in the surface of the substrate 201, and the surface of the substrate 201 is formed with the OLED light-emitting layer 205, and the baffle wall 206 is formed in the trench 202. The surface of the substrate 201 is provided with the first water blocking layer 207 covering the display area 2011, the water blocking area 2012, and the pre-cutting area 2013, and the surface of the first water blocking layer 207 is formed with the stress buffer layer 208.

The surface of the substrate 201 is provided with a second water blocking layer 209 covering the display area 2011, the water blocking area 2012, and the pre-cutting area 2013, and the second water blocking layer is made of the same material as the first water blocking layer 207, and will not be repeated for brevity.

Figure 2F:
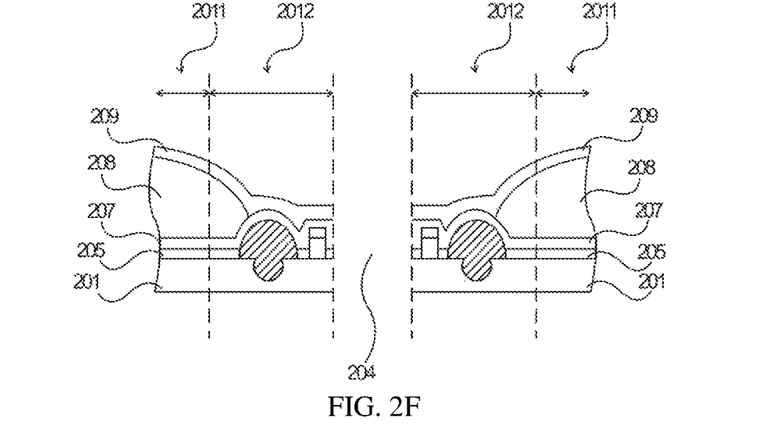

As shown in FIG. 2F, the OLED display panel includes the substrate 201 having the surface defined with the display area 2011, the water blocking area 2012 located in the display area 2011, and the pre-cut area 2013 located in the water blocking area 2012. The trench 202 and the crack arresting member 203 are formed in the surface of the substrate 201, and the surface of the substrate 201 is formed with the OLED light-emitting layer 205, and the baffle wall 206 is formed in the trench 202. The surface of the substrate 201 is provided with the first water blocking layer 207 covering the display area 2011, the water blocking area 2012, and the pre-cutting area 2013, and the surface of the first water blocking layer 207 is formed with the stress buffer layer 208 and the second water blocking layer 209.

The pre-cut region 2013 is removed by a laser cutting technique to form the via hole 204, wherein edges of the opening of the first water blocking layer 207 and the second water blocking layer 209 are aligned with the edge of the via hole 204, and the stress buffer layer 208 is formed outside the baffle wall 206.

Figure 3A:
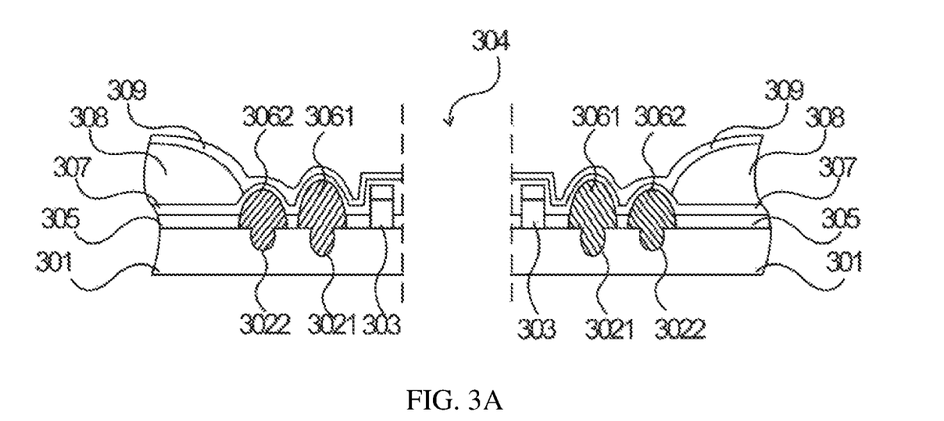
FIG. 3A is a schematic cross-sectional structural view showing a structure of an OLED display panel provided by the present invention.

As shown in FIG. 3A, the OLED display panel includes a substrate 301, a trench 302, a crack arresting member 303, an OLED light-emitting layer 305, a baffle wall 306 formed in the trench 302, a first water blocking layer 307, a stress buffer layer 308, and a second water blocking layer 309 disposed on a surface of the substrate 301.

The surface of the substrate 301 is formed with a first sub-trench 3021 and a second sub-trench 3021. The first sub-trench 3021 is defined around a through-hole 304, and the second sub-trench 3021 is defined around the first sub-trench 3021. A first sub-baffle wall 3061 is disposed in the first sub-trench 3021, and a second sub-baffle wall 3062 is disposed in the second sub-trench 3021. A height of the first sub-baffle wall 3061 is greater than a height of the second sub-baffle wall 3062, wherein the stress buffer layer 308 is formed outside the second sub-baffle wall 3062. By providing two levels of the baffle walls, the path of water vapor intruding into the display area 3011 can be prolonged, thereby further protecting the OLED light-emitting layer 305 from water vapor intrusion.

Figure 3B:
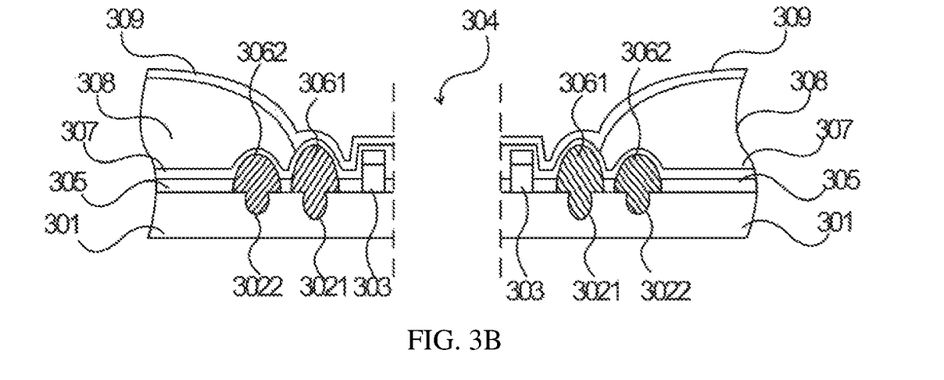
FIG. 3B is a schematic cross-sectional view showing a structure of another OLED display panel provided by the present invention.

As shown in FIG. 3B, the stress buffer layer 308 is formed outside the first sub-baffle wall 3061 and covers the second sub-baffle wall 3062 to increase a coverage area of the thin film encapsulation layer, thereby further improving the water vapor blocking of the device, such that the service life of the OLED light-emitting device can be further improved.

The invention has beneficial effects that compared with the existing organic light-emitting diode (OLED) display panel, the OLED display panel of the present invention is provided with a water blocking wall at the cutting position, which isolates the water vapor from the light-emitting device at the cutting position and the light-emitting device in the display area, thereby protecting the light-emitting device in the panel from water vapor intrusion, thus prolonging the display life of the OLED display panel. As a result, the problems of the existing in-screen profile cutting technology can be solved, such as that the cutting portion is not protected by the encapsulation layer after the OLED display panel is cut, thereby exposing the light-emitting device, and the water vapor intrudes the OLED display panel from the cutting position, causing damage to the light-emitting device, which in turn negatively affects the display quality of the entire panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) display panel, comprising a substrate, an OLED light-emitting layer disposed on a surface of the substrate, and a thin film encapsulation layer disposed on a surface of the OLED light-emitting layer; wherein
a display area of the OLED display panel is formed with a via hole and a water blocking structure for protecting the via hole from water vapor, the water blocking structure comprises:
a trench defined in the surface of the substrate, the trench disposed around the via hole; and
a baffle wall formed in the trench and protruding from the surface of the OLED light-emitting layer; wherein a contour shape of the baffle wall is a same as a contour shape of the via hole, and the via hole is located at a center of the contour of the baffle wall;
the thin film encapsulation layer comprises a water blocking layer and a stress buffer layer which are stacked on each other, and an edge of an opening of the water blocking layer is aligned with an edge of the via hole, and the stress buffer layer is formed outside the baffle wall;
wherein the water blocking structure comprises a first sub-trench and a second sub-trench, the first sub-trench being disposed around the via hole, the second sub-trench being disposed around the first sub-trench; and
a first sub-baffle wall is disposed in the first sub-trench, and a second sub-baffle wall is disposed in the second sub-trench.

2. The OLED display panel of claim 1, wherein an inner wall of the trench is inclined or curved toward a center of the trench.

3. The OLED display panel of claim 2, wherein a height of the first sub-baffle wall is greater than a height of the second sub-baffle wall.

4. The OLED display panel of claim 3, wherein the stress buffer layer is formed outside the second sub-baffle wall.

5. The OLED display panel according to claim 3, wherein the stress buffer layer is formed outside the first sub-baffle wall and covers the second sub-baffle wall.

6. The OLED display panel according to claim 1, wherein the baffle wall is made of a curable liquid moisture absorbent or an organic material doped with moisture absorbing particles.

7. The OLED display panel according to claim 1, wherein the surface of the substrate is further provided with a crack arresting member, and the crack arresting member is disposed around the via hole, and located between the baffle wall and the via hole.

8. The OLED display panel of claim 1, wherein the contour shape of the via hole is a regular planar pattern or an irregular planar pattern.

9. The OLED display panel according to claim 8, wherein the via hole is located at a position close to an edge of the OLED panel, or the via hole is integrally defined by the edge of the OLED panel.

10. An organic light-emitting diode (OLED) display panel, comprising a substrate, an OLED light-emitting layer disposed on a surface of the substrate, and a thin film encapsulation layer disposed on a surface of the OLED light-emitting layer; wherein     a display area of the OLED display panel is formed with a via hole and a water blocking structure for protecting the via hole from water vapor, and the water blocking structure comprises:

a trench defined in the surface of the substrate, the trench being disposed around the via hole; and     a baffle wall formed in the trench and protruding from the surface of the OLED light-emitting layer; wherein     the thin film encapsulation layer comprises a water blocking layer and a stress buffer layer which are stacked on each other, and an edge of an opening of the water blocking layer is aligned with an edge of the via hole, and the stress buffer layer is formed outside the baffle wall;

wherein the water blocking structure comprises a first sub-trench and a second sub-trench, the first sub-trench being disposed around the via hole, the second sub-trench being disposed around the first sub-trench; and     a first sub-baffle wall is disposed in the first sub-trench, while a second sub-baffle wall is disposed in the second sub-trench.

11. The OLED display panel of claim 10, wherein an inner wall of the trench is inclined or curved toward a center of the trench.

12. The OLED display panel of claim 11, wherein a height of the first sub-baffle wall is greater than a height of the second sub-baffle wall.

13. The OLED display panel of claim 12, wherein the stress buffer layer is formed outside the second sub-baffle wall.

14. The OLED display panel according to claim 12, wherein the stress buffer layer is formed outside the first sub-baffle wall and covers the second sub-baffle wall.

15. The OLED display panel according to claim 10, wherein the baffle wall is made of a curable liquid moisture absorbent or an organic material doped with moisture absorbing particles.

16. The OLED display panel according to claim 10, wherein the surface of the substrate is further provided with a crack arresting member, and the crack arresting member is disposed around the via hole, and located between the baffle wall and the via hole.

17. The OLED display panel of claim 10, wherein the contour shape of the via hole is a regular planar pattern or an irregular planar pattern.

18. The OLED display panel according to claim 17, wherein the via hole is located at a position close to an edge of the OLED panel, or the via hole is integrally defined by the edge of the OLED panel.

* * * * *